(12) United States Patent
Tremlett et al.

(10) Patent No.: US 9,698,124 B2
(45) Date of Patent: Jul. 4, 2017

(54) EMBEDDED CIRCUIT PACKAGE

(71) Applicant: Microsemi Semiconductor Limited, Caldicot, Monmouthshire (GB)

(72) Inventors: Piers Tremlett, Coleford (GB); Richard Birch, Caldicot (GB)

(73) Assignee: Microsemi Semiconductor Limited, Caldicot, Monmouthsh (GB)

( * ) Notice: Subject to any disclaimer, the term of this patent is extended or adjusted under 35 U.S.C. 154(b) by 0 days.

(21) Appl. No.: 15/055,669

(22) Filed: Feb. 29, 2016

(65) Prior Publication Data

US 2016/0260685 A1 Sep. 8, 2016

Related U.S. Application Data

(60) Provisional application No. 62/127,344, filed on Mar. 3, 2015.

(51) Int. Cl.
*H01L 21/768* (2006.01)
*H01L 25/065* (2006.01)
(Continued)

(52) U.S. Cl.
CPC .......... *H01L 25/0652* (2013.01); *H01L 21/56* (2013.01); *H01L 25/105* (2013.01); *H01L 25/50* (2013.01); *H01L 23/3121* (2013.01); *H01L 24/29* (2013.01); *H01L 24/32* (2013.01); *H01L 24/45* (2013.01); *H01L 24/48* (2013.01); *H01L 24/83* (2013.01); *H01L 24/85* (2013.01); *H01L 2224/291* (2013.01); *H01L 2224/2919* (2013.01); *H01L 2224/29191* (2013.01); *H01L 2224/32225* (2013.01); *H01L 2224/32237* (2013.01); *H01L 2224/32245* (2013.01); *H01L 2224/45124* (2013.01);
(Continued)

(58) Field of Classification Search
CPC . H01L 51/56; H01L 51/0074; H01L 51/0073; H01L 51/0067; C09K 11/025
USPC .......................................... 257/744; 438/629
See application file for complete search history.

(56) References Cited

U.S. PATENT DOCUMENTS 5,622,588 A * 4/1997 Weber ................. H01L 21/4803
156/150
6,271,056 B1 * 8/2001 Farnworth ............. H01L 24/06
257/685

(Continued)

OTHER PUBLICATIONS

Johannes Stahr; "Hermes Newsletter No. 01, Nov. 2009"; published by www.hermes-ect.net.

(Continued)

*Primary Examiner* — Andy Huynh
(74) *Attorney, Agent, or Firm* — Simon Kahn

(57) ABSTRACT

An embedded integrated circuit package is made by providing a substrate with a patterned conductor layer defining bond pads. One or more components typically with upwardly facing contact pads are mounted on the substrate. The contact pads are wire bonded to the bond pads of the patterned conductor layer. A series of layers, each with one or more cut-outs corresponding to locations of the components forms a first solid stack containing cavities accommodating the components and associated wires. In one embodiment the layers are fiberglass layers and the layers are cured in the presence of a resin to form a solid body. In another embodiment the layers are thermoplastic layers.

18 Claims, 2 Drawing Sheets

(51) Int. Cl.
*H01L 25/00* (2006.01)
*H01L 21/56* (2006.01)
*H01L 25/10* (2006.01)
*H01L 23/00* (2006.01)
*H01L 23/31* (2006.01)
*H05K 1/18* (2006.01)

(52) U.S. Cl.
CPC ............... *H01L 2224/45139* (2013.01); *H01L 2224/45144* (2013.01); *H01L 2224/45147* (2013.01); *H01L 2224/48091* (2013.01); *H01L 2224/48105* (2013.01); *H01L 2224/48227* (2013.01); *H01L 2224/48245* (2013.01); *H01L 2224/73265* (2013.01); *H01L 2224/8385* (2013.01); *H01L 2224/83447* (2013.01); *H01L 2224/83851* (2013.01); *H01L 2224/85447* (2013.01); *H01L 2224/92247* (2013.01); *H01L 2225/0651* (2013.01); *H01L 2225/06548* (2013.01); *H01L 2924/00014* (2013.01); *H01L 2924/14* (2013.01); *H01L 2924/15311* (2013.01); *H01L 2924/186* (2013.01); *H01L 2924/1811* (2013.01); *H05K 1/186* (2013.01); *H05K 2201/0141* (2013.01); *H05K 2201/0154* (2013.01); *H05K 2201/0195* (2013.01)

(56) References Cited

U.S. PATENT DOCUMENTS

| | | |
|---|---|---|
| 6,744,141 B2 | 6/2004 | Kimura |
| 7,345,885 B2 | 3/2008 | Boudreaux et al. |
| 7,718,471 B1 | 5/2010 | Zaccardi |
| 8,318,549 B2 * | 11/2012 | Hess .............. H01L 21/565 257/787 |

OTHER PUBLICATIONS

Theodore G. Tessier, Tanja Karila, Tuomas Waris, Mark Dhaenens, David Clark; Laminate Based Fan-Out Embedded Die Technologies: The Other Option; Published by FlipChp International LLC, Phoenix Arizona.

E. Jan Vardaman, Linda C. Matthew, Karen Carpenter; "Market Drivers for Embedded Components Packaging"; Published 2013 by TechSearch International, Inc.; www.techsearchinc.com.

* cited by examiner

EMBEDDED CIRCUIT PACKAGE

CROSS REFERENCE TO RELATED APPLICATION

This application claims the benefit under 35 USC 119 (e) of prior U.S. provisional application No. 62/127,344, filed Mar. 3, 2015, the contents of which are herein incorporated by reference.

FIELD OF THE INVENTION

This invention relates to the field of integrated circuits, and in particular to a method of making embedded circuit packages.

BACKGROUND OF THE INVENTION

In the semiconductor industry, there is an increasing trend toward vertical integration in order to achieve higher packing density.

There are basically three ways of mounting a die on a substrate: a) flip chip (i.e. face down) soldered to the traces of the conductor layer patterned on the substrate, b) face up with contacts on top, and c) face up using wire bonding to connect to an underlying conductor layer patterned on the substrate.

Flip chip techniques can be difficult to use in an embedded environment because inherent limitations on tracks widths and alignment accuracy. Most flip chip techniques require a redistribution layer, which is an extra layer providing contact paths. This adds to cost and complexity of the device. In case b) vias are required through the die to reach the contacts.

It is known to build up three-dimensional (3D) structures that allow lateral components to be integrated into the same vertical package. One example is described in Laminate Based Fan-Out Embedded Die Technologies: The Other Option, Theodore (Ted) G. Tessier, Tanja Karila*, Tuomas Waris*, Mark Dhaenens and David Clark, Flip Chip International, Another is described in AT_S Hermes Newsletter, no. 01, November 2009.

The Hermes process requires extra plating on the die pads to provide a diffusion barrier for the copper interconnect. This adds cost to the die. Also the fine pitch capability discussed in the Hermes project requires complicated and expensive: laser drilling, photoexposure or an extra redistribution layer to achieve the fine pitch capability.

Despite the fact that wire bonding is preferred because wire bonding can connect to the underlying patterned layer without requiring an upper patterned layer to make the connections, and is also applicable to other components, such as resistors, lamination for vertical integration dictates the use of either flip chip or face up technologies since the laminates would squash the wire connections.

U.S. Pat. No. 7,718,471 discloses a vertical arrangement of dies spaced apart by layers of epoxy. The bond pads on the upwardly facing dies are connected to the underlying printed circuit board by wires extending out of the integrated package. This patent requires a separate stack or tower for each column of dies. It does not allow for components placed laterally on the substrate to be integrated into the vertical package.

SUMMARY OF THE INVENTION

By using the laminates with cut-outs that form cavities in the assembled stack to accommodate the components and the wires, embodiments of the invention are able to use wire bonding in a 3D structure with the attendant advantages of not requiring an upper connection layer etc., and the ability then permit the addition of additional stacks with additional components on top. Wire bonding considerably simplifies the process by not requiring an extra layer of PCB interconnect above the die, which would otherwise mean the laminated panels would need to be sent back to a PCB manufacturer for further processing thereby increasing cost and complicating logistics.

According to the present invention there is provided a method of making an embedded integrated circuit package comprising providing a substrate with a patterned conductor layer defining conductive bond pads; mounting one or more components on the substrate; wire bonding the one or more components to the bond pads of the patterned conductor layer with bonding wires; and laminating a first series of support layers, each with one or more cut-outs corresponding to locations of a respective one of the components to form a solid stack containing cavities accommodating the components and the associated bonding wires.

The components may be face-up dies or integrated circuit chips with contact pads on the upper surface, in which case the wires are bonded to the contact pads, but they can include other components such as resistors, and the like.

The orientation reference relates to the manner in which the dies are typically mounted onto the substrate. The dies are not flip chip bonded, but are mounted facing up with the contact pads wire bonded to traces on the conductor layer provided on the substrate. The contact pads of the dies face away from the substrate on which the die is to be placed. In this manner, it is easy to accommodate other components, such as resistors and capacitors in the cavities.

Using this method, unlike the Hermes prior art, it is possible to use aluminum wire in the bonding for higher temperature applications.

In one embodiment the support layers are fibrous layers, such as fiberglass layers, which may be pre-impregnated with resin, although pre-impregnation is not essential. The cavity(ies) can also be filled with suitable filler, or the resin exuded from the layers can be used to fill the cavities. In an alternative embodiment the support layers may be thermoplastic layers, such as liquid crystal polymer layers (LCP). In the latter case the lamination occurs as a result of the application of heat and pressure.

The dies can be conveniently mounted directly on the conductor layer, with either conductive or non conductive adhesive, but is will be appreciated that they can also be mounted directly on the substrate, for example, a printed circuit board, if the conductor layer is etched away at the die locations.

Additional stacks can be built up on top of the first stack to provide a vertically integrated package.

Furthermore, vias can be drilled through the package to interconnect upper and lower conductor layers. In addition, conductor pathways can be formed on the sidewalls of the stack.

According to another aspect of the invention there is provided an integrated circuit package comprising a substrate with a patterned conductor layer defining bond pads; one or more components mounted on the substrate; bonding wires connecting the components to the bond pads of the patterned conductor layer; a first solid laminated stack of support layers, each with one or more cut-outs respectively corresponding to locations of the one or more components forming cavities accommodating the dies and associated bonding wires.

BRIEF DESCRIPTION OF THE DRAWINGS

The invention will now be described in more detail, by way of example only, with reference to the accompanying drawings, in which:

FIG. 4b is an end view of the package shown in FIG. 4a; and

DETAILED DESCRIPTION OF THE PREFERRED EMBODIMENTS

Figure 1:
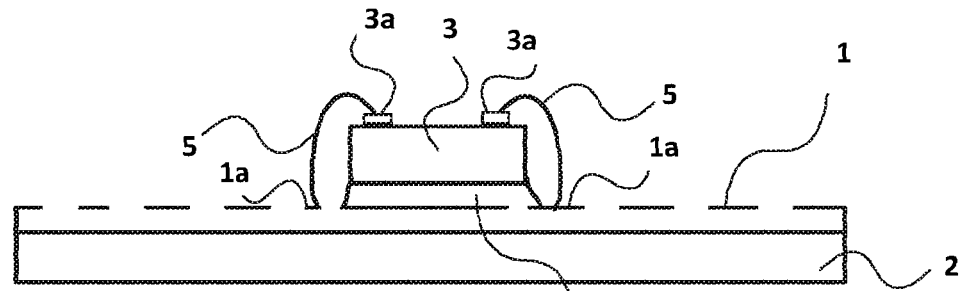
FIG. 1 shows a partly formed embedded circuit package.

The manufacture of an embedded circuit package in accordance with embodiments of the invention will now be described with reference to FIGS. 1 to 3.

In a first step the conductor layer 1, typically of copper, laid on a dielectric printed circuit board 2 is patterned to form bond pads 1a providing the desired electrical connections for one or more components 3. The conductor layer 1 and printed circuit board 2 together form a substrate for the package. However, the printed circuit board 2 may not be present, leaving only the conductor layer 1 itself as the substrate on which the package is formed.

The components 3 can be integrated circuit dies (chips) diced from a wafer, or other electrical components, such as capacitors and resistors. The printed circuit board 2 may also include a patterned underlying conductor layer (not shown) to provide a double-sided printed circuit board.

Next the one or more components 3 are bonded, face up, i.e. with the bond pads 3a facing upwardly away from conductor layer 1, onto the conductor layer 1 with a suitable adhesive layer 4, such as epoxy, silicone or solder. The adhesive layer 4 may be conductive or non conductive. The components 3 could alternatively be bonded directly onto the printed circuit board 2 if the conductor layer 1 is etched away at the location of the components 3.

Next wires 5 are welded to the bond pads 3a of component 3, and to bond pads 1a of conductor layer 1, to provide the appropriate electrical connections. This technique is known as wire bonding. Such a technique is, for example, described in U.S. Pat. No. 7,718,471, the contents of which are herein incorporated by reference. The wires 5 can be suitable conductors, such as aluminum, copper, silver, and gold. The bond pads 1a can be connected to other components via traces of the conductor layer 1 on the printed circuit board 2.

Figure 2A:
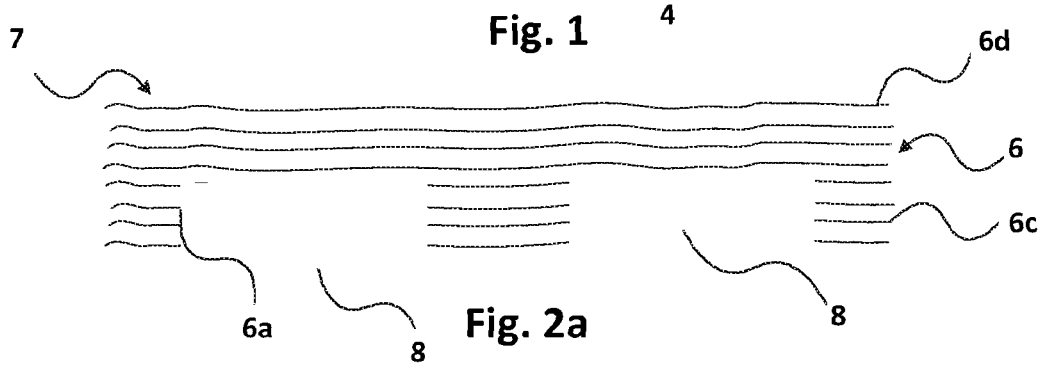
FIG. 2a shows a series of pre-impregnated fiberglass layers used in making the package.
Figure 2B:
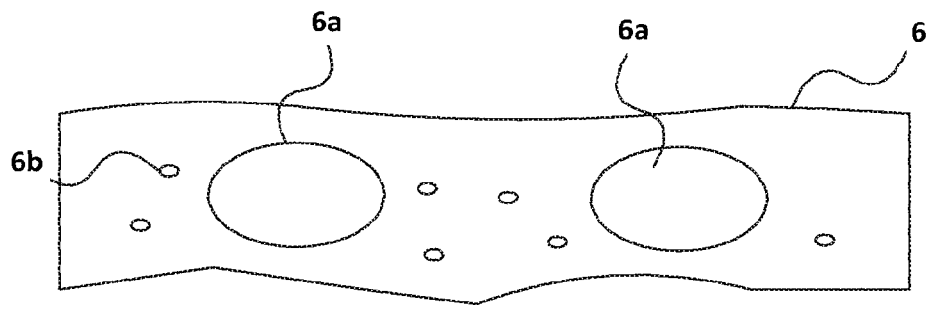
FIG. 2b is a plan view of a portion of an individual fiberglass layer.
Figure 3:
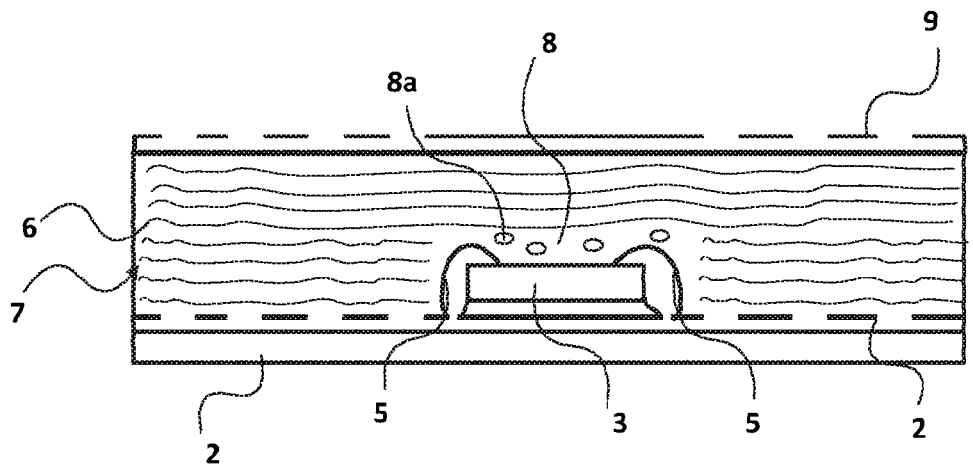
FIG. 3 shows completed embedded circuit package in accordance with a first embodiment of the invention.

Next a series of support layers 6, each optionally constituted of fiberglass, and optionally pre-impregnated with uncured PCB epoxy/polymer resin as shown in FIGS. 2a and 2b, is laid one by one on to the conductor layer 1 to form a stack 7 surrounding the components 3. The lower support layers 6c consist of thin layers of fiber glass matting or woven fiber glass impregnated with uncured PCB epoxy/polymer resin 6b, which have cut-outs 6a in them so that when they are aligned and laminated together they form cavities 8 to accommodate the one or more components 3. The upper support layers 6d do not have cut-outs and act as spacer layers to close off the cavities 8 and complete the stack 7. The lower support layers 6c are shown in FIGS. 2a and 2b with two cut-outs 6a, but typically they may have any number of cut-outs 6a to match the number of components 3 on the printed circuit board 2. In the case of FIG. 3 only one component and cavity is shown for illustrative purposes. The upper support layers 6d could be omitted so long as the cavities 8 are sufficient to accommodate the components 3.

In an alternative embodiment the fiberglass support layers 6 are not pre-impregnated; instead the resin is applied to the individual support layers 6 as they are laminated onto the device one by one. The package is then cured in the presence of the resin. Alternatively, the support layers 6 can be thermoplastic layers, such as liquid crystal polymer (LCP).

Typically as heat and pressure is applied to the fiberglass support layers 6 during lamination, epoxy resin 8a exudes from the fiberglass support layers 6 to fill the cavities 8.

The cavities 8 can be filled with a plastic medium 8a, such as polyimide or epoxy, or can be left unfilled. Other forms of fibrous mat, whether woven or not, could be used in place of fiberglass to form stack 7 without exceeding the scope of the invention.

In a still further embodiment support layers 6 are each constituted of a solid thermoplastic layers, such as LCP (liquid crystal polymer). In this case, heat is applied to the stack as to soften the individual LCP support layers 6 and bond them together.

A conductor layer 9, which may be constituted of copper, is then placed on top of the stack 7 and the assembly is cured by the application of heat, UV or other means to form a solid integrated package. If desired the conductor layer 9 can be patterned to interconnect other components. Once the assembly has been cured, it can be cut down to size. Alternatively, the conductor layer 9 may be absent, or may be part of a single or double-sided printed circuit board laid on top of the stack 7.

The wires 5 make the connections between the bond pads 3a of the components 3 and the bond pads 1a on the underlying substrate. The upper conductor layer 9 is provided to permit additional components, either dies or discrete components, to be provided on top of the stack 7. The upper conductor layer 9 is thus not necessary to make connections to components 3 embedded within the stack 7 as would be the case for conventional face-up technology.

Figure 4A:
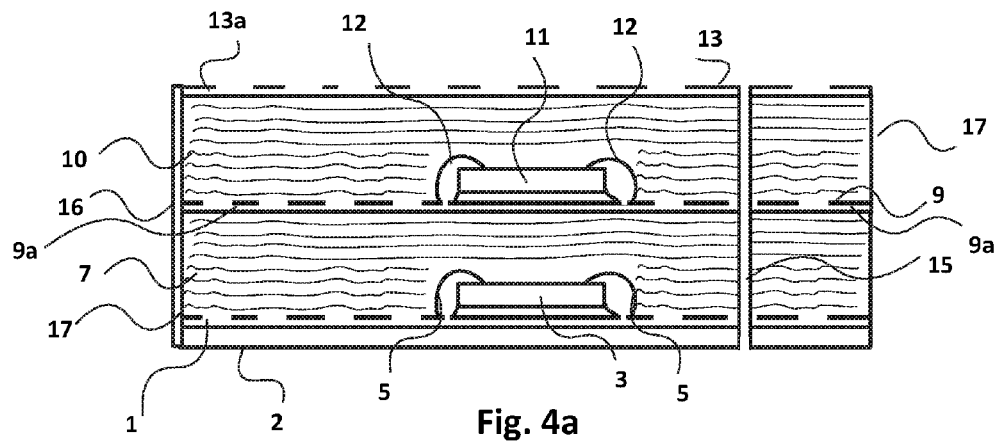
FIG. 4a shows is a sectional view of an embedded circuit package in accordance with a second embodiment of the invention.

The process can be repeated as shown in FIG. 4a to add another stack 10 containing one or more components 11 wire bonded by wires 12 to traces of the patterned conductor layer 9 in a similar manner to the components 3. A further patterned conductor layer 13 can be provided on the upper stack 10. Additional stacks containing further components can be formed on top the stack 10 as desired to build up a vertical arrangement of superposed components. Any reasonable number of stacks can be superimposed. The conductor layers 9, 13 may be optionally spaced from the respective stacks by one or more extra layers 9a, 13a of a plastic or resin-impregnated fiber glass.

There are different methodologies for applying the individual layers in the case of multiple stacks:

1. Put all the loose layers together for all the stacks and laminate to build up the complete multi-stack assembly in one operation;
2. Laminate the individual layers one by one; and
3. Laminate the solid individual stacks, for example, as three separate laminated stacks in the case of a three-high die high stack.

Figure 4B:
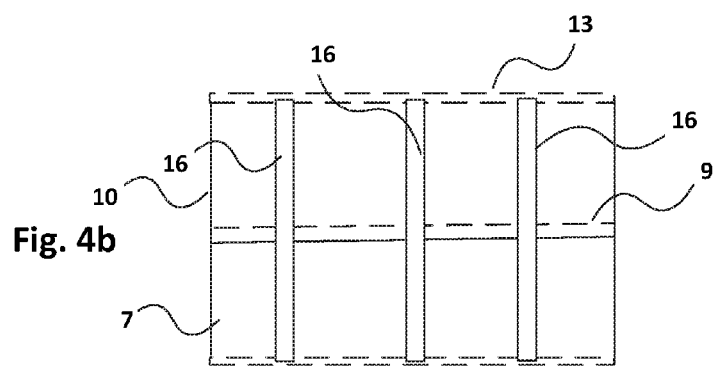

Conductive pathways can be provided through the stacks 7, 10 by forming vias 15 containing conductive material through the superposed stacks 7, 10 or by providing conductors 16, for example of copper, on the end walls 17 of the stacks 7, 10 as shown in FIG. 4b. The conductors can, if desired, be in the form of patterned traces obtained from a copper coating and these form pathways from across the package.

Figure 5:
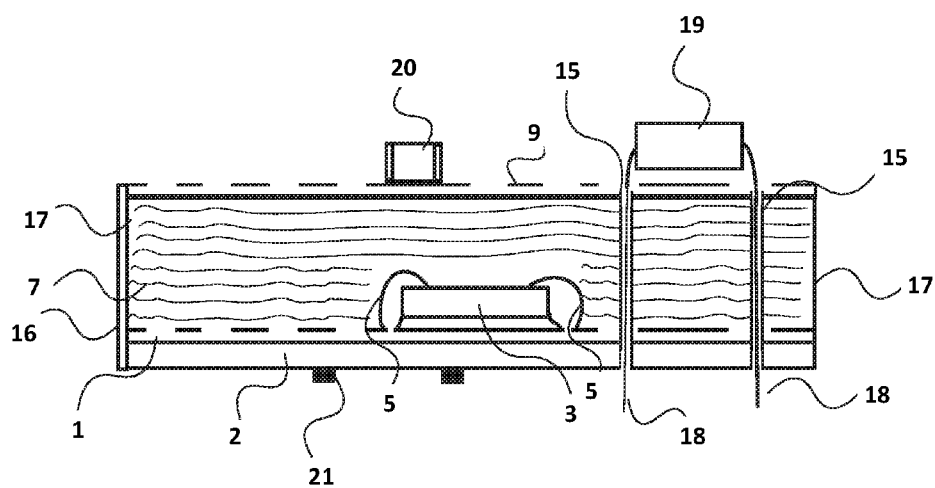
FIG. 5 shows an embedded package in accordance with a third embodiment of the invention.

In another embodiment shown in FIG. 5, vias 15 are drilled through the stack 7 and carry wires 18 connected to component 19 maintained above the upper conductor layer 9. They can also provide connections between the traces in the patterned conductor layer 9 and similar traces (not shown) on the bottom side of the printed circuit board 2.

Solder pads or solder balls 21 may also be provided on the underside of the printed circuit board 2 to make the device into a surface mount device, such that the entire assembly can be surface-mounted onto a support.

Additional components 20 mounted on the conductor layer 9 can be connected to the underside of the printed circuit board by additional vias, or alternatively by conductive pathways 16 formed on the end wall 17 of the stack 7. The traces can be provided by depositing a copper layer and patterning it, or gluing copper strips to the end wall.

Unlike the prior art, where all stacks have to be formed in one process, embodiments of the invention allow the stacks to be formed individually, tested and then stacked together one above the other.

Once assembled and laminated, the wires are completely covered and protected, and multiple components of different types, shapes and sizes, can be included in each stack. For example, a stack may contain dies (chips), resistors, capacitors, and other electronic components, making it a more versatile process.

Each stack can be connected with PCB vias allowing a much more complicated package structure, and embodiments of the present invention allow for components on the top surface of the PCB and components or balls on the bottom of the PCB. The invention may be applied to anything from a complicated populated large PCB to a small single die package.

The invention claimed is:

1. A method of making an embedded, vertically integrated circuit package comprising:
   providing a substrate with a first patterned conductor layer defining conductive bond pads;
   mounting a plurality of first components on the substrate;
   wire bonding said first components to the bond pads of the first patterned conductor layer with bonding wires;
   laminating a first series of support layers, each with a plurality of cut-outs corresponding to locations of a respective one of the first components to form a solid first stack containing cavities accommodating the first components and the bonding wires associated with said first components;
   laminating additional support layers without cut-outs over the first series of layers to complete the first stack;
   forming a second patterned conductor layer defining conductive bond pads on a top surface of the first stack;
   mounting a plurality of second components on the top surface of the first stack;
   wire bonding said second components to the bond pads of the second patterned conductor layer with bonding wires;
   laminating a second series of support layers, each with a plurality of cut-outs corresponding to locations of a respective one of said second components to form a solid second stack containing cavities accommodating the second components and the bonding wires associated with said second components; and
   forming vertical conductive pathways across the package for providing connections between vertically spaced elements of said package.

2. The method as claimed in claim 1, further comprising laminating additional support layers without cut-outs over the first second series of layers to complete the second stack.

3. The method as claimed in claim 2, further comprising filling the cavities with filler.

4. The method as claimed in claim 2, wherein one or more of said first and second components comprise dies with contact pads facing away from the provided substrate, and the bonding wires are bonded to the contact pads.

5. The method as claimed in claim 1, wherein said support layers are selected from the group consisting of: thermoplastic and resin-impregnated fiberglass.

6. The method as claimed in claim 1, wherein said vertical conductive pathways are vias containing conductive material.

7. The method as claimed in claim 1, wherein said vertical conductive pathways are conductive traces on end walls of said stacks.

8. The method as claimed in claim 1, further comprising providing a second upper conductive layer on a top surface of the second stack.

9. An embedded, vertically integrated circuit package comprising:
   a substrate with a first patterned conductor layer defining bond pads;
   a plurality of first components mounted on the substrate;
   bonding wires connecting the first components to the bond pads of the first patterned conductor layer;
   a solid laminated first stack of a first series of support layers, each with a plurality of cut-outs corresponding to respective locations of said first components and forming cavities accommodating said first components and the bonding wires associated with said first components;
   additional support layers without cut-outs over the first series of support layers to complete the first stack;
   a second patterned conductor layer defining conductive bond pads on a top surface of the first stack;
   a plurality of second components mounted on the top surface of the first stack;
   bonding wires connecting said second components to the bond pads of the second patterned conductor layer;
   a second solid laminated stack of a second series of support layers, each with a plurality of cut-outs corresponding to locations of a respective one of said second components to form a solid second stack containing cavities accommodating the second components and the bonding wires associated with said second components; and
   vertical conductive pathways extending across the package to provide connections between vertically spaced elements of said package.

10. The embedded, vertically integrated circuit package as claimed in claim 9, further comprising a filler in the cavities.

11. The embedded, vertically integrated, embedded circuit package as claimed in claim 9, further comprising additional layers without cut-outs laid over the second series of support layers to complete the second stack.

12. The embedded, vertically integrated circuit package as claimed in claim 9, wherein one or more of said first and second components comprise dies with contact pads facing away from the provided substrate, and said bonding wires are bonded to said contact pads.

13. The embedded, vertically circuit package as claimed in 9, wherein said support layers are selected from the group consisting of: resin-impregnated fiberglass and thermoplastic layers.

14. The embedded, vertically integrated circuit package as claimed in claim 9, wherein said conductive pathways are vias containing conductive material extending through the first stack to provide conductive pathways through the first stack for said second components in the second stack.

15. The embedded vertically integrated circuit package as claimed in claim 9, wherein said conductive pathways comprise conductive traces on at least one end wall of the first stack to provide conductive pathways around the first stack for said second components in the second stack.

16. The embedded vertically integrated circuit package as claimed in claim 9, further comprising a third patterned conductor layer on a top surface of said second stack.

17. The embedded, vertically integrated circuit package as claimed in claim 16, further comprising vias extending through the first and second stacks and providing conductive pathways through the package for components on the third patterned conductor layer.

18. The embedded, vertically integrated circuit package as claimed in claim 16, further comprising conductive traces on end walls of the first and second stacks and providing conductive pathways across the package for components on the third conductor patterned layer.

* * * * *